United States Patent [19]

Mui

[11] Patent Number: 4,547,887
[45] Date of Patent: Oct. 15, 1985

[54] PSEUDO-RANDOM CONVOLUTIONAL INTERLEAVING

[75] Inventor: Shou Y. Mui, Carlisle, Mass.

[73] Assignee: The United States of America as represented by the Secretary of the Army, Washington, D.C.

[21] Appl. No.: 556,661

[22] Filed: Nov. 30, 1983

[51] Int. Cl.⁴ ............................................. G06F 11/10
[52] U.S. Cl. ............................................. 375/1; 371/44
[58] Field of Search ............... 178/22.04, 22.05, 22.06; 370/68, 82; 371/2, 37, 39, 40, 43, 44, 45; 375/1

[56] References Cited

U.S. PATENT DOCUMENTS

| 3,508,197 | 4/1970 | Tong | 371/44 |
| 4,291,406 | 9/1981 | Bahl et al. | 371/44 |
| 4,394,642 | 7/1983 | Currie et al. | 371/40 |
| 4,425,644 | 1/1984 | Scholz | 371/2 |

OTHER PUBLICATIONS

IEEE Transactions on Information Theory, vol. IT-16, No. 3, May 1970, John L. Ramsey, "Realization of Optimum Interleavers".

IEEE Transactions on Communications Technology, vol. COM-19, No. 5, Oct. 1971, G. David Forney, Jr., "Burst-Correcting Codes for the Classic Bursty Channel".

Primary Examiner—Benedict V. Safourek
Attorney, Agent, or Firm—Anthony T. Lane; Jeremiah G. Murray; Robert A. Maikis

[57] ABSTRACT

A method and apparatus for interleaving and deinterleaving psuedo-randomly a digital signal which is transmitted over a transmission channel is disclosed. A received bit stream is interleaved such that the order of the bits is varied in a non-random manner. The order of the interleaved bits is permutated in a pseudo-random manner and the bits are then transmitted over a transmission channel. The received bits are inverse permuted so as to return the order of the received bits to the order of the bits after the non-random interleaving step. The inverse permuted bits are then deinterleaved in the reverse order in which they were interleaved so as to reconstitute the original bit stream.

14 Claims, 3 Drawing Figures

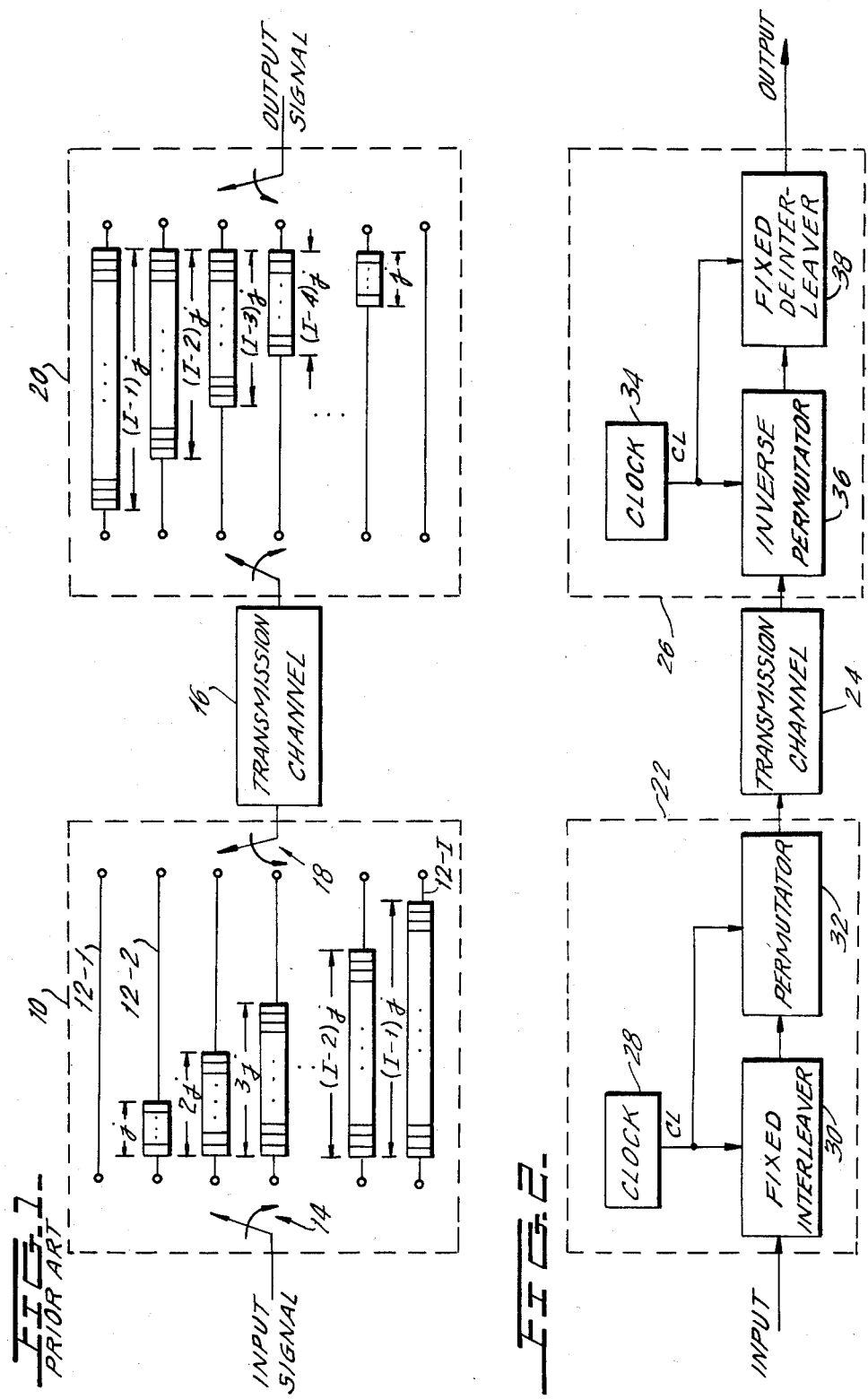

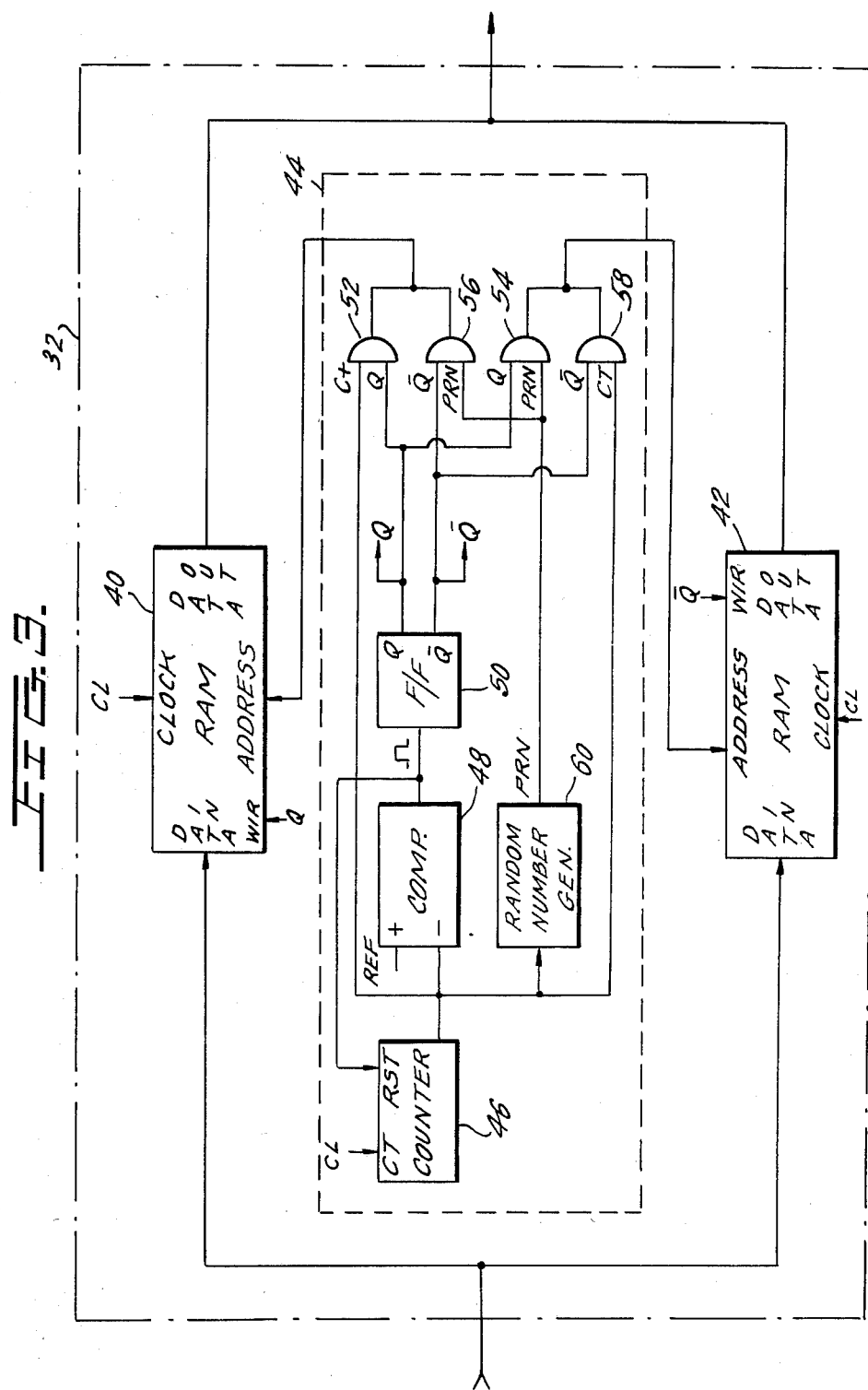

PSEUDO-RANDOM CONVOLUTIONAL INTERLEAVING

GOVERNMENT RIGHTS

The Government has rights in this invention pursuant to Contract No. DAAK 80-81-C-0039 awarded by the Department of the Army.

BACKGROUND OF THE INVENTION

The present invention is directed towards a method and apparatus for interleaving and deinterleaving pseudorandomly a digital signal transmitted over a transmission channel which introduces random or burst errors or specific error patterns into the information to be transmitted. More particularly, the present invention is directed towards a method and apparatus utilizing pseudorandom convolutional interleaving to minimize the effect of these errors on the information being transmitted.

It is well known that errors in the transmission of digital information which would otherwise occur as a result of channel noise can be minimized by forward error-correction encoding an input digital sequence before it is applied to the transmission channel and then decoding the digital sequence when it is received at the other side of the transmission channel. This result follows from the Shannon channel coding theory which is described, for example, in A. J. Viterbi and J. K. Omura, *Principles of Digital Communication and Coding* (1979).

Most practical decoders are designed to correct random channel errors. The performance of random-error-correction decoders degrades in the face of burst errors in the transmission channel. If the error burst is too long, the decoder will not be able to properly reconstruct the original signal. An effective remedy to this problem is the use of an interleaver which randomizes the errors (separates them in time) and permits the decoder to work properly.

A known fixed convolutional interleaver-deinterleaver is illustrated in FIG. 1. Fixed convolutional interleaving has been described by J. S. Ramsey (reference: "Realization of Optimum Interleavers", IEEE Trans. on Inform. Th., Vol. IT-16, No. 3, pp. 338-345, May 1970) and G. D. Forney, Jr. (reference: "Burst-Correcting Codes for the Classical Bursty Channel", IEEE Trans. on Comm. Tech., Vol. COM-19, No. 5, pp. 772-781, Oct. 1971). As shown therein, an input signal (a continuous bit stream) is applied to an interleaver 10 which temporarily stores the received bits and transmits them in a different, but non-random, order from which they were received. In the embodiment illustrated, interleaver 10 comprises I delay lines 12-1 through 12-I, each of which receives a successive bit of the input digital signal. To this end, a commutator 14 switches from one delay line to the next in cyclic fashion at the bit rate of the input signal. While commutator 14 is shown as a mechanical element, it should be recognized by those skilled in the art that the commutator will normally be formed electronically using, for example, an appropriate transistor switching network.

Each of the delay lines, except delay line 12-1, includes a shift register (unnumbered) to which the bits applied to that delay line is stepped at a frequency of $f/I$, wherein f is the bit rate of the digital input signal. To this end, each time a given delay line 12-2 through 12-I receives another bit of the input digital signal, the shift register of that delay line will receive a clock signal which causes each of the elements stored in that shift register to shift to the right by 1. Each successive shift register has j more bits than the prior shift register such that each successive delay line delays the bits applied thereto by an additional j bits.

The output of each of the delay lines 12-1 through 12-I is connected to a transmission channel 16 via a commutator 18 which switches from one delay line to the next in cyclic fashion in synchronism with commutator 14. Again, while commutator 18 is shown as a mechanical commutator, an electronic commutator will normally be used.

As a result of the foregoing, an interleaver input of $\ldots a_i a_{i+1} a_{i+2} \ldots$ will result in the following interleaver output:

$$\ldots a_i a_{i-(J-1)} a_{i-2(J-1)} \ldots a_{i-(I-1)(j-1)} a_{i+} {}^{l} a_{i+I-(J-1)} \ldots a_{i+1} \ldots$$

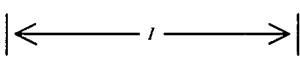

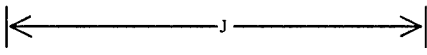

wherein I is the number of delay lines and $J=jI$.

The interleaved bits transmitted over the transmission channel 16 is received by a deinterleaver 20 which is constructed in the reverse manner to interleaver 10 such that the first delay line has (I-1)j bits of storage and the final delay line has no storage. The reconstructed input signal will appear at the output of deinterleaver 20 with a total delay of J(I-1) bits.

The result of the foregoing is that the convolutional interleaver of FIG. 1 (known generally as an (I,J) interleaver) will sufficiently randomize channel error bursts at the output of deinterleaver 20 as long as the error burst remains below J bits in length. Particularly, as long as the transmission channel 16 introduces error bursts of length no longer than J bits, then the errors in the output signal appearing at the output of deinterleaver 20 results from that burst will be separated by at least I-2 bits, which can be made acceptable by choosing the parameter I appropriately.

While the foregoing structure successfully randomizes error bursts below J bits in length, certain periodic error patterns (as opposed to error bursts) cannot be sufficiently randomized. For example, an error pattern having one error every $J+1$ bits would result in I successive bit errors at the output of deinterleaver 20. The primary object of the present invention is to provide protection against such periodic error patterns, as well as protection against error bursts of J bits or less.

BRIEF DESCRIPTION OF THE INVENTION

In order to decrease the sensitivity of the system the periodic channel errors, the present invention interposes a permutation device between the fixed convolutional interleaver and the transmission channel and interposes a depermutation device between the transmission channel and the fixed convolutional deinterleaver. The permutation and depermutation devices can be of either a fixed length or variable length type. In either case, a block of bits received from the fixed convolutional interleaver is permuted (that is, the order of the bits of that block are scrambled in a pseudo-random manner) and the permuted information is transmitted over the transmission channel. This information is received by the inverse permutator which reverses the permutation process such that the order of each bit in each block of bits is returned to its original sequence and then the bit information is applied to a deinterleaver so as to reconstruct the original digital information.

BRIEF DESCRIPTION OF THE DRAWINGS

For the purpose of illustrating the invention, there is shown in the drawings several embodiments which are presently preferred, it being understood, however, that this invention is not limited to the precise arrangements and instrumentalities shown.

FIG. 1 is a schematic diagram of a conventional convolutional interleaver.

FIG. 2 is a block diagram of a fixed length pseudorandom convolutional interleaver in accordance with the present invention.

FIG. 3 is a block diagram illustrating one possible construction of the permutator of FIG. 2.

DETAILED DESCRIPTION OF THE PREFERRED EMBODIMENTS

Referring to FIG. 2, a transmitter 22 receives from a forward-error-correction encoder a digital input signal (a continuous bit stream) and applies it to a transmission channel 24 after appropriate interleaving. The transmitted signal is received by a receiver 26 which deinterleaves the bit information and generates digital output which faithfully reproduces the ordering of the original input bits. The deinterleaver output is sent to a forward-error-correction decoder.

The transmitter 22 includes a master clock 28, a fixed interleaver 30 and a permutator 32. The receiver includes a master clock 34, an inverse permutator 36 and a fixed deinterleaver 38. The clocks 28, 34 serve to synchronize the operation of elements 30, 32, 36 and 38 to ensure time transparency of the bit stream. The clocks must be synchronized with each other, as well as with the bit rate of the input signal. Synchronism between clocks 28, 34 can be performed in any known manner, for example by the periodic transmission of a synchronizing signal. While the manner in which the input digital signal is generated does not form a part of the present invention, the bit rate of the input digital signal must be synchronized with the frequency of the clock 28. To this end, the clock signals generated by clock 28 can be applied to the source of the digital signals, i.e., the forward-error-correction encoder, to cause the bits of the digital signal to be applied to the transmitter 22 at the clock rate.

The fixed interleaver 30 can take the form illustrated in FIG. 1, with the commutators 14, 16 being switched from delay line to delay line at the frequency of the clock signals of clock 28.

The permutator 32 divides the output sequence of the interleaver 30 into sub-sequences or data blocks L bits in length and permutes (changes) the order at which the bits of that block are transmitted in a pseudo-random manner. This can be achieved using either a fixed or a variable block length L. One possible permutator having a fixed block length L is illustrated in FIG. 3.

As shown therein, a pair of random access memories (RAMs) 40, 42 are connected in parallel between the input and output of permutator 32. The input of permutator 32 is connected to the DATA-IN inputs of RAMs 40, 42 while the output of permutator 32 is connected to the DATA-OUT outputs thereof.

Each RAM 40, 42 has a storage capacity at least equal to the block length L. At any given instant, one of the RAMs 40, 42 will be receiving and storing the bits of a present data block while the remaining RAM 40, 42 will be transmitting (in permuted order) the bits of the last data block. That RAM 40, 42 which is receiving bits of the present data block will be referred to as the receiving RAM and is operated in the receive mode (it will be writing information into its memory locations), while the RAM 40, 42 which is transmitting in permutated order the bits of the prior data block will be referred to as the transmitting RAM and is operated in the transmit mode (it will be reading information out of its memory locations). The operation of RAMs 40, 42 is controlled by a control circuit 44 which alternately transfers each RAM 40, 42 between the receiving and transmitting mode of operation. Control circuit 44 includes a counter 46 whose count input CT receives the clock signals CL generated by clock 28. The count in counter 46 is incremented by 1 in response to each successive clock signal. The output of counter 46 is applied to a comparator 48 which compares the count in counter 46 to a reference value REF equal to the block length L minus 1. Whenever the count in counter 46 is equal to L minus 1, comparator 48 will generate a binary "1" which is applied to the reset input RST of counter 46 and will cause the count in counter 46 to reset to 0. As a result, a positive going pulse will appear at the output of comparator 48 each time the receiving RAM 40, 42 has received an entire data block of L bits.

The output of comparator 48 is also applied to a flip-flop 50 whose outputs toggle in response to each successive pulse appearing at the output of comparator 48. The Q output of flip-flop 50 is applied to the read/write input W/R of RAM 40 while the $\overline{Q}$ output of flip-flop 50 is applied to the read/write input W/R of RAM 42. In this manner, whenever flip-flop 50 is set, RAM 40 will be operated in the receiving mode while RAM 42 will be operated in the transmit mode. Conversely, whenever flip-flop 50 is reset, RAM 40 will be operated in the transmit mode, while RAM 42 will be operated in the receive mode.

When the RAM 40, 42 is operated in the receive mode, its read/write input W/R will be at the binary "1" level and it will read the bit applied to its DATA-IN input into the storage location identified by the address signal applied to its ADDRESS input whenever the clock signal CL applied to its CLOCK input goes high. Conversely, whenever the RAM 40, 42 is operated in the transmit mode, its read/write input W/R will be at the binary "0" level and it will transfer to its DATA-OUT output that bit stored at the storage location identified by the address signal applied to its ADDRESS input when the clock signal CL applied to its CLOCK input goes high.

The RAMs 40, 42 are switched between the transmit and receive modes by a logic circuit comprising AND gate 52-58. AND gates 52, 54 receive the $\overline{Q}$ output of flip-flop 50 while AND gates 56, 58 receive the Q output of flip-flop 50. AND gates 52, 56 determine the address signal to be applied to the ADDRESS input of RAM 40. When RAM 40 is operating in the receive mode, the ADDRESS input must be incremented sequentially for each data bit applied to the DATA-IN input of RAM 40. To this end, the output of counter 46 is gated through AND gate 50 whenever the Q output of flip-flop 50 is set (and RAM 40 is being operated in the receive mode). When RAM 40 is operated in the transmit mode, the address signals applied to the ADDRESS input of RAM 40 must vary in a pseudo-random manner such as to permute the manner in which the received bits of the last data block are transmitted by the permutator 32. To this end, the output of counter 46 is applied to a random number generator 60 which generates a pseudo-random number PRN for each clock pulse. The pseudo-random number PRN generated by random number generator 60 is applied to AND gate 56 and will be gated thereby and applied to the ADDRESS input of RAM 40 whenever the $\bar{Q}$ output of flip-flop 50 is at the binary "1" level.

The pseudo-random number PRN generated by random number generator 60 is applied to AND gate 54 and the output of counter 46 is applied to AND gate 58 so as to similarly ensure that RAM 42 will read the data bits applied to its DATA-IN input into successive address locations when the RAM 42 is operated in the receive mode and to ensure that the stored bits will be read out in a pseudo-random order determined by random number generator 60 when RAM 42 is operated in the transmit mode.

The circuit of FIG. 3 can be simply modified to operate as a variable length permutator (i.e. a permutator whose data block length L varies) by modifying the random number generator 60 and changing the reference value applied to the non-inverting input of comparator 48. By way of simple example, it will first be presumed that the fixed length permutator described above permutes the input bits in bit blocks of 10 bits each. In that case, the reference value REF would be 9 and the count in counter 46 would cycle between 0 and 9. The random number generator 60 would generate the number 0 through 9 in a permuted order as a function of the output of counter 46.

In a variable length permutator, the number of bits in successive data blocks could vary in a pseudo-random manner. The block length could not vary in a truly random manner since the receiver 26 must reverse the permutation process and must therefore know the order in which the block lengths change. For this reason, the sequence of block lengths must repeat after some predetermined time period. By way of simple example, the block lengths may vary in the following order: 8, 4, 12, 6, 15 and 5 for a total of 50 bits. While this 50-bit sequence will continually repeat itself, the subsequence of each bit block will vary.

The control circuit 44 of FIG. 3 can easily be modified to operate in this manner by setting the reference value REF equal to 50 and by programming the random number generator 60 (or replacing it with a new random number generator) in such a manner that it will generate pseudo-random numbers which will first permute the numbers 0 through 7 (corresponding to the first 8 bit block), will then permute the numbers 8 through 11 (corresponding to the second bit clock), etc.

The present invention may be embodied in other specific forms without departing from the spirit or essential attributes thereof and, accordingly, reference should be made to the appended claims, rather than the foregoing specification, as indicating the scope of the invention.

What is claimed is:

1. A method for interleaving and deinterleaving a digital signal transmitted over a transmission channel, said method comprising the steps of:

receiving a stream of bits;
   interleaving the order of said bits in a non-random manner;
   permuting the order of said interleaved bits in a pseudo-random manner;
   transmitting said permuted, interleaved bits over a transmission channel;
   receiving said transmitted bits;
   inverse permuting said received bits so as to return the order of said received bits to the order of said bits after said interleaving step; and thereafter
   deinterleaving said bits in the reverse order in which they were interleaved so as to reconstitute the original said bit stream.

2. The method of claim 1, wherein said stream of bits is a continuous bit stream.

3. The method of claim 1, wherein said permutation step comprises the steps of:
   dividing said interleaved bits into a plurality of data blocks; and
   for each individual data block, rearranging the order of the bits in that said data block in a pseudo-random manner.

4. The method of claim 3, wherein each said data block is of equal length.

5. The method of claim 3, wherein the length of each said data block is varied in a pseudo-random manner.

6. The method of claim 1, wherein said interleaving step is carried out using a convolutional interleaver.

7. Apparatus for interleaving a digital signal to be transmitted over a transmission channel, said apparatus comprising:
   an interleaver for interleaving the order of the stream of bits in a non-random manner;
   a permutator for permuting the order of said interleaved bits in a pseudo-random manner; and
   a transmitter for transmitting said permuted, interleaved bits over a transmission channel.

8. The apparatus of claim 7, wherein said permutator comprising:
   means for dividing said interleaved bits into a plurality of data blocks; and
   means for rearranging the order of the bits in each respective said data block in a pseudo-random manner.

9. The apparatus of claim 8, wherein each said data block is of equal length.

10. The apparatus of claim 8, wherein the length of each said data block is varied in a pseudo-random manner.

11. Apparatus, comprising:
    (a) a transmitter including:
       (1) an interleaver having an input and an output, the input of said interleaver receiving a stream of bits, said interleaver interleaving the order of said bits in a non-random manner and applying said interleaved bits to the output of said interleaver;
       (2) a permutator having an input and an output, the input of said permutator being coupled to the output of said interleaver, said permutator permuting the order of said interleaved bits in a pseudo-random manner and applying said interleaved, permuted bits to said output thereof, said output being connected to a transmission channel; and
    (b) a receiver, including:

(1) an inverse permutator having an input and an output, the input of said inverse permutator being connected to said transmission channel and receiving said transmitted bits, said inverse permutator permuting said received bits so as to return the order of said received bits to the order of said bits after they have been interleaved by said interleaver, said inverse permuted bits being applied to the output of said inverse permutator; and (2) a deinterleaver having an input and an output, the input of said deinterleaver being connected to the output of said inverse permutator, said deinterleaver deinterleaving said bits in the reverse order in which they were interleaved by said interleaver so as to reconstitute the original said bit stream, said deinterleaver applying said reconstituted bit stream to the output thereof.

12. The apparatus of claim 11, wherein said permutator comprises:
    means for dividing said interleaved bits into a plurality of data blocks; and
    means for rearranging the order of the bits in each respective said data block in a pseudo-random manner.

13. The apparatus of claim 12, wherein each said data block is of equal length.

14. The apparatus of claim 12, wherein the length of each said data block is varied in a pseudo-random manner.

* * * * *